(12) United States Patent
Cao et al.

(10) Patent No.: US 11,156,726 B2
(45) Date of Patent: Oct. 26, 2021

(54) METHODS OF MAKING AND USING AN X-RAY DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/742,820

(22) Filed: Jan. 14, 2020

(65) Prior Publication Data
US 2020/0150287 A1 May 14, 2020

Related U.S. Application Data

(63) Continuation of application No. PCT/CN2017/094441, filed on Jul. 26, 2017.

(51) Int. Cl.
*G01N 23/04* (2018.01)
*G01T 1/20* (2006.01)
(Continued)

(52) U.S. Cl.
CPC .......... *G01T 1/2006* (2013.01); *G01T 1/1645* (2013.01); *G01T 1/2002* (2013.01); *H01L 27/14676* (2013.01)

(58) Field of Classification Search
CPC ... G01T 1/2006; G01T 1/1645; G01T 1/2002; G01T 1/2928; G01T 1/241; H01L 27/14676
See application file for complete search history.

(56) References Cited

U.S. PATENT DOCUMENTS 5,245,191 A  9/1993 Barber et al.
5,677,539 A * 10/1997 Apotovsky ............. G01T 1/241
                                              250/370.13
(Continued)

FOREIGN PATENT DOCUMENTS

CN  101600974 A  12/2009
CN  101862200 A  10/2010
(Continued)

OTHER PUBLICATIONS

Kenney, C. J., et al. "Active-edge planar radiation sensors." Nuclear Instruments and Methods in Physics Research Section A: Accelerators, Spectrometers, Detectors and Associated Equipment 565.1 (2006): 272-277.

(Continued)

*Primary Examiner* — Kiho Kim
(74) *Attorney, Agent, or Firm* — IPro, PLLC; Qian Gu

(57) ABSTRACT

Disclosed herein are methods of making and using an absorption-unit array suitable for X-ray detection and a detector comprising such an absorption-unit array. The methods of making the absorption-unit array may include forming the absorption-unit array on a substrate and forming a guard ring encompassing more than one absorption units of the absorption-unit array after separating the absorption-unit array from the substrate; or may include forming a plurality of absorption units and a guard ring encompassing more than one of the absorption units on a portion of a substrate after separating the portion from the substrate. The method of using an absorption-unit array may include using some of the absorption units of the absorption-unit array as a guard ring by applying an electrical voltage. A detector suitable for X-ray detection comprises an absorption layer and an electronics layer, wherein the absorption layer comprises an absorption-unit array.

15 Claims, 23 Drawing Sheets

(51) Int. Cl.
     *G01T 1/164*     (2006.01)
     *H01L 27/146*     (2006.01)

(56) References Cited

U.S. PATENT DOCUMENTS

| | | | | |
|---|---|---|---|---|
| 2005/0167606 | A1* | 8/2005 | Harrison | G01T 1/241 |
| | | | | 250/370.13 |
| 2008/0203313 | A1* | 8/2008 | Harrison | G01T 1/2928 |
| | | | | 250/371 |
| 2013/0266114 | A1* | 10/2013 | Chen | G01N 23/046 |
| | | | | 378/10 |
| 2015/0069252 | A1* | 3/2015 | Eichenseer | G01T 1/247 |
| | | | | 250/370.09 |

FOREIGN PATENT DOCUMENTS

| | | | |
|---|---|---|---|
| CN | 103430533 | A | 12/2013 |
| JP | 2002217444 | A | 8/2002 |
| JP | 2015190853 | A | 11/2015 |
| TW | 201713966 | A | 4/2017 |
| WO | 2004047179 | A1 | 6/2004 |
| WO | 2017004824 | A1 | 1/2017 |

OTHER PUBLICATIONS

Parker, Sherwood I., et al. "3DX: An X-ray pixel array detector with active edges." IEEE transactions on nuclear science 53.3 (2006): 1676-1688.

* cited by examiner

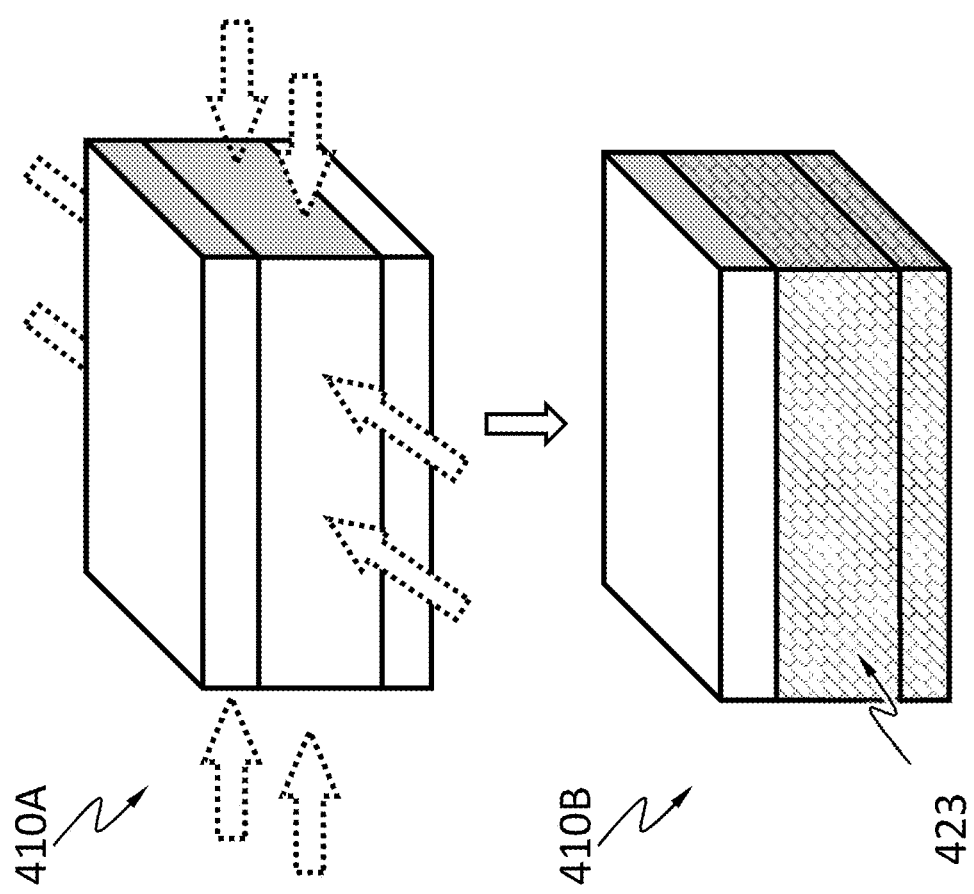

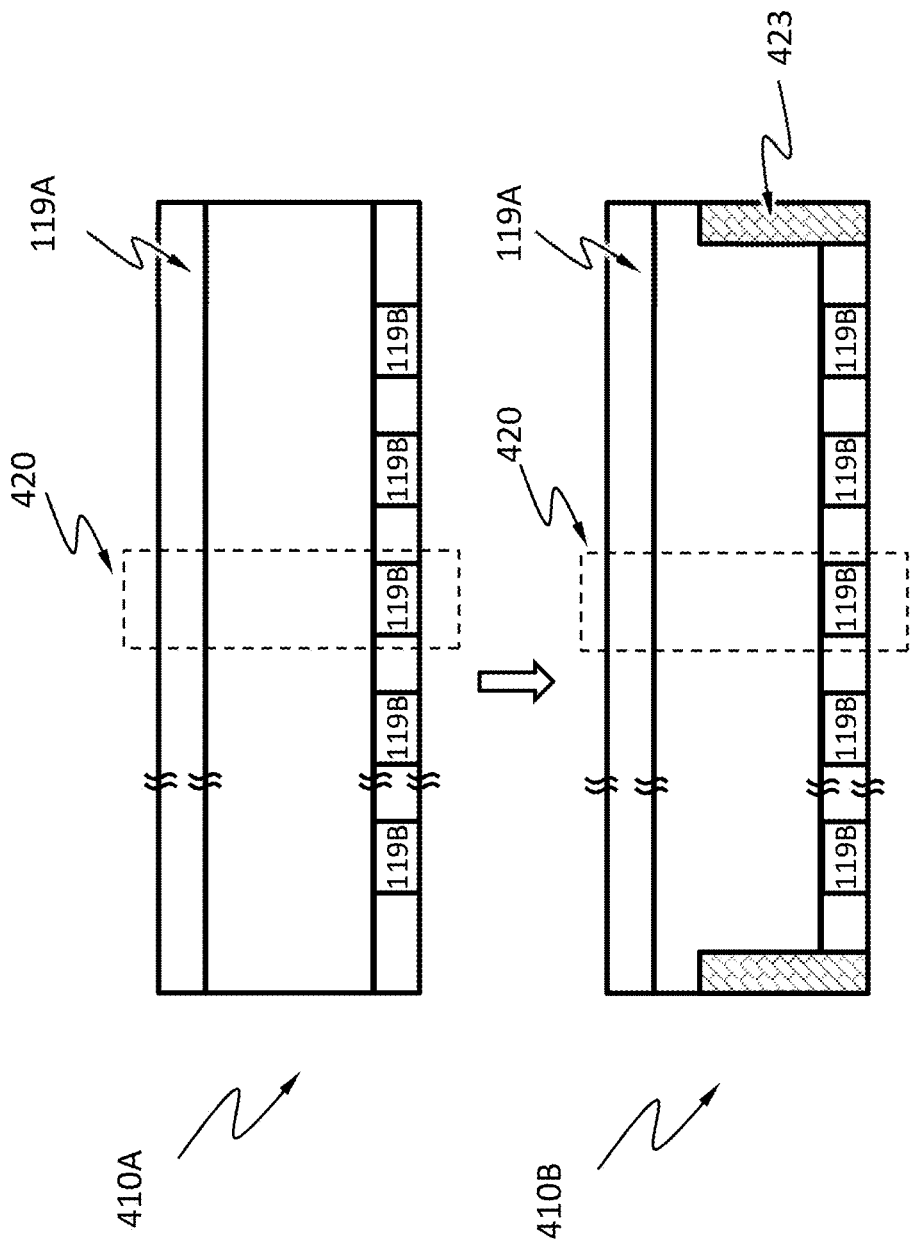

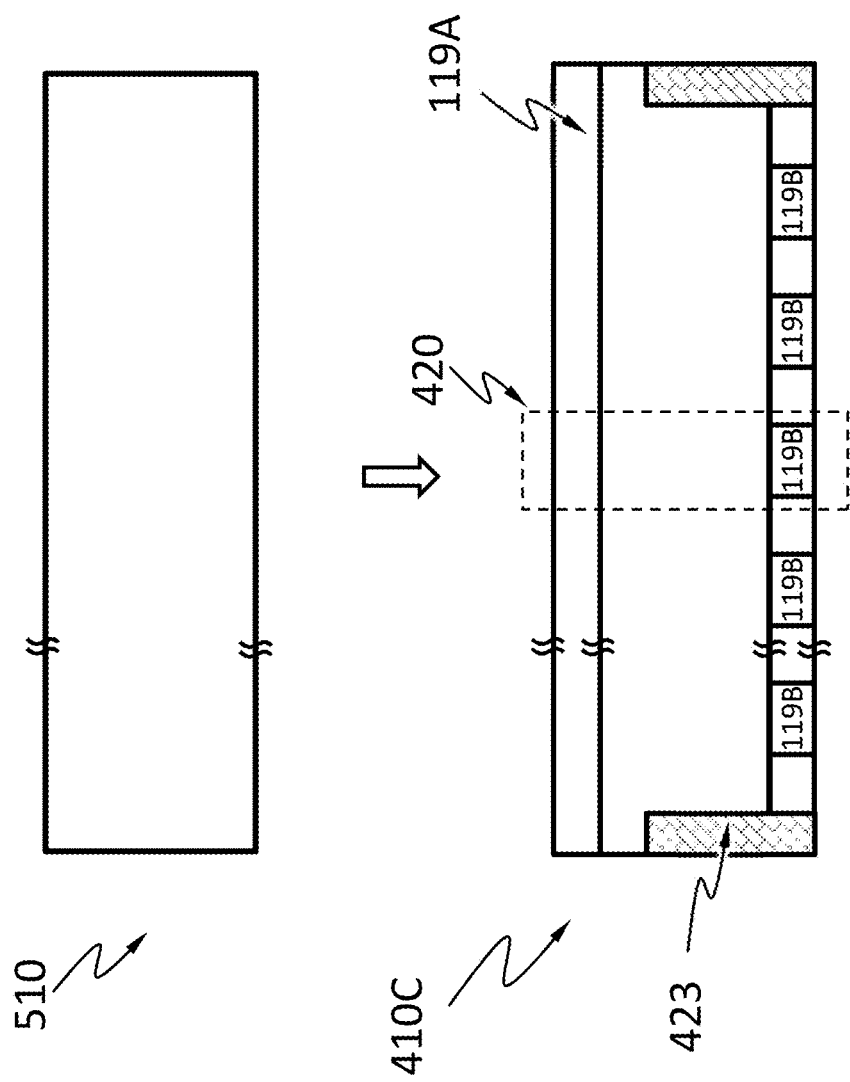

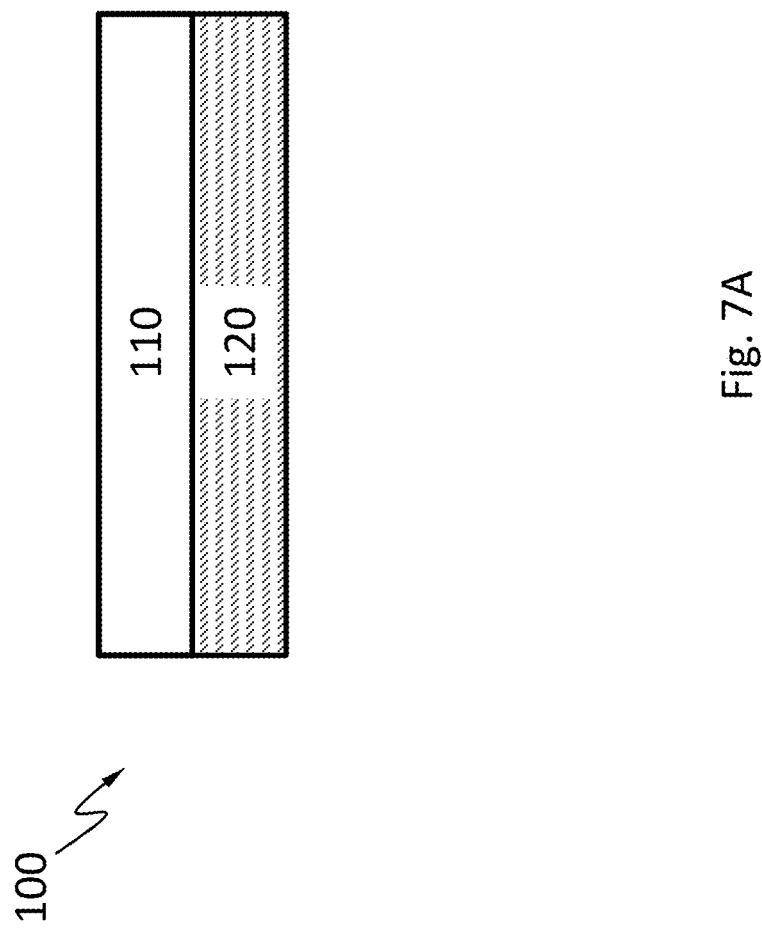

METHODS OF MAKING AND USING AN X-RAY DETECTOR

TECHNICAL FIELD

The disclosure herein relates to methods of making and using an X-ray detector that has an absorption-unit array.

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is a method for making an absorption-unit array suitable for detecting X-ray, the method comprising: forming an absorption-unit array on a substrate, wherein the absorption-unit array comprises a plurality of absorption units configured to absorb X-rays, wherein at least one of the absorption units does not comprise a guard ring therein and not encompassed in a guard ring before the absorption-unit array is separated from the substrate; separating the absorption-unit array from the substrate.

According to an embodiment, the absorption-unit array comprises silicon, germanium, GaAs, CdTe, CdZnTe, or a combination thereof.

According to an embodiment, each of the absorption units comprises an electric contact.

According to an embodiment, each of the absorption units comprises a diode.

According to an embodiment, each of the absorption units comprises a resistor.

According to an embodiment, the method further comprises: forming a doped sidewall on the absorption-unit array after separating the absorption-unit array from the substrate, wherein the doped sidewall encompasses more than one of the absorption units.

According to an embodiment, forming the doped sidewall comprises doping sidewalls of the absorption-unit array and annealing.

Disclosed herein is a method for making an absorption-unit array suitable for detecting X-ray, the method comprising: separating a portion of a substrate from the substrate; forming an absorption-unit array on the portion of the substrate after separating the portion, wherein the absorption-unit array comprises a plurality of absorption units and a doped sidewall, wherein the absorption units are configured to absorb X-rays, wherein the doped sidewall encompasses more than one of the absorption units.

According to an embodiment, the absorption-unit array comprises silicon, germanium, GaAs, CdTe, CdZnTe, or a combination thereof.

According to an embodiment, each of the absorption units comprises an electric contact.

According to an embodiment, each of the absorption units comprises a diode.

According to an embodiment, each of the absorption units comprises a resistor.

According to an embodiment, forming the absorption-unit array comprises forming the doped sidewall by doping sidewalls of the portion of the substrate.

According to an embodiment, the doped sidewall is formed before the absorption units are formed.

According to an embodiment, the doped sidewall is formed after the absorption units are formed.

Disclosed herein is a method for using an absorption-unit array suitable for detecting X-ray, the method comprising: obtaining an absorption-unit array comprising a first plurality of absorption units along a perimeter of the absorption-unit array and a second plurality of absorption units in an interior of the absorption-unit array; electrically shielding the second plurality of absorption units by applying an electrical voltage to the first plurality of absorption units.

According to an embodiment, the first plurality of absorption units are identical to the second plurality of absorption units.

According to an embodiment, the absorption-unit array comprises silicon, germanium, GaAs, CdTe, CdZnTe, or a combination thereof.

According to an embodiment, each of the absorption units comprises an electric contact.

According to an embodiment, each of the absorption units comprises a diode.

According to an embodiment, each of the absorption units comprises a resistor.

Disclosed herein is a detector, comprising: an X-ray absorption layer comprising an absorption-unit array, wherein the absorption-unit array comprises a plurality of absorption units, wherein each of the absorption units comprises an electric contact, wherein at least one of the absorption units does not comprise a guard ring therein, wherein at least some of the absorption units are configured to absorb X-rays and generate electrical signals on the electric contacts thereof from the X-rays absorbed; a first voltage comparator configured to compare a voltage of the electric contact to a first threshold; a second voltage comparator configured to compare the voltage to a second threshold; a controller; a plurality of counters each associated with a bin and configured to register a number of X-ray photons absorbed by at least one of the absorption units wherein the energy of the X-ray photons falls in the bin; wherein the controller is configured to start a time delay from a time at which the first voltage comparator determines that an absolute value of the voltage equals or exceeds an absolute value of the first threshold; wherein the controller is configured to determine whether an energy of an X-ray photon falls into the bin; wherein the controller is configured to cause the number registered by the counter associated with the bin to increase by one.

According to an embodiment, the detector further comprises a capacitor module electrically connected to the electric contact, wherein the capacitor module is configured to collect charge carriers from the electric contact.

According to an embodiment, the controller is configured to activate the second voltage comparator at a beginning or expiration of the time delay.

According to an embodiment, the controller is configured to connect the electric contact to an electrical ground.

According to an embodiment, a rate of change of the voltage is substantially zero at expiration of the time delay.

According to an embodiment, the absorption-unit array of the detector comprises a guard ring encompassing more than one of the absorption units.

BRIEF DESCRIPTION OF FIGURES

FIG. 3A-FIG. 3C schematically show forming an absorption-unit array based on the absorption-unit array of FIG. 2A or FIG. 2B, according to an embodiment.

FIG. 4C-FIG. 4E schematically show a process of forming the absorption-unit array of FIG. 4A or FIG. 4B, according to an embodiment.

FIG. 7A schematically shows a cross-sectional view of the detector, according to an embodiment.

DETAILED DESCRIPTION

Figure 1A:
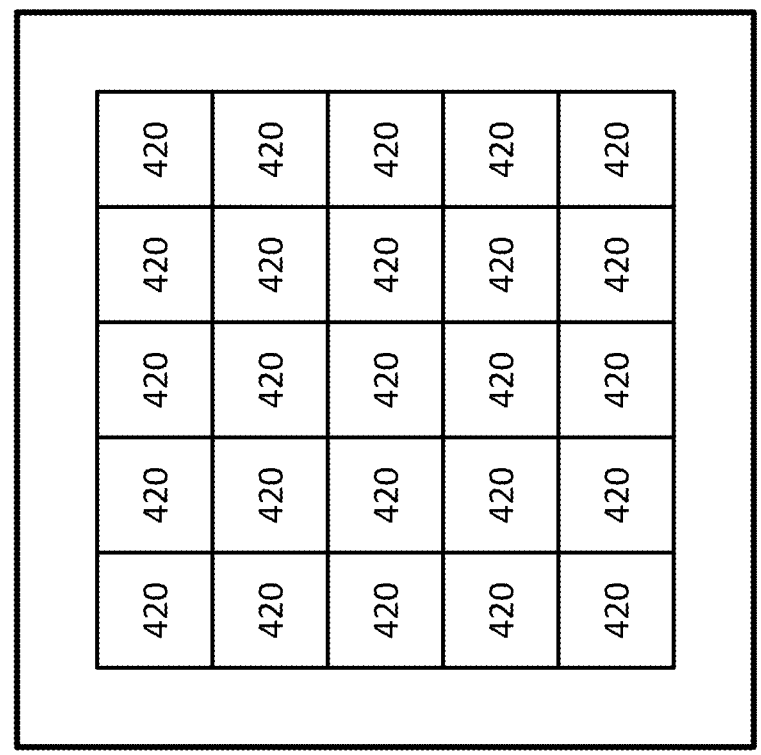
FIG. 1A schematically shows an absorption-unit array, according to an embodiment.
Figure 1A:

FIG. 1A schematically shows an absorption-unit array 410, according to an embodiment. The absorption-unit array 410 has an array of absorption units 420. Each absorption unit 420 may comprise a semiconductor and an electric contact. Each absorption unit 420 may be configured to absorb incident X-ray and generate electrical signals. The electrical signals may be voltage signals on the electric contact. The absorption-unit array 410 may comprise guard rings to prevent premature breakdown due to locally concentrated electric field and surface potential differences at the electric contact or to provide electrical isolation for the absorption units 420. The absorption-unit array 410 may include a semiconductor material such as, silicon, germanium, GaAs, CdTe, CdZnTe, or a combination thereof. The semiconductor material may have a high mass attenuation coefficient for the X-ray energy of interest. In an embodiment, the absorption-unit array 410 does not comprise a scintillator. The absorption-unit array 410 may be a rectangular array, a honeycomb array, a hexagonal array or any other suitable array. The absorption units 420 on the array 410 may be arranged into one or more grids. For example, the absorption units 420 may be arranged into two grids with a gap in between.

Figure 1B:
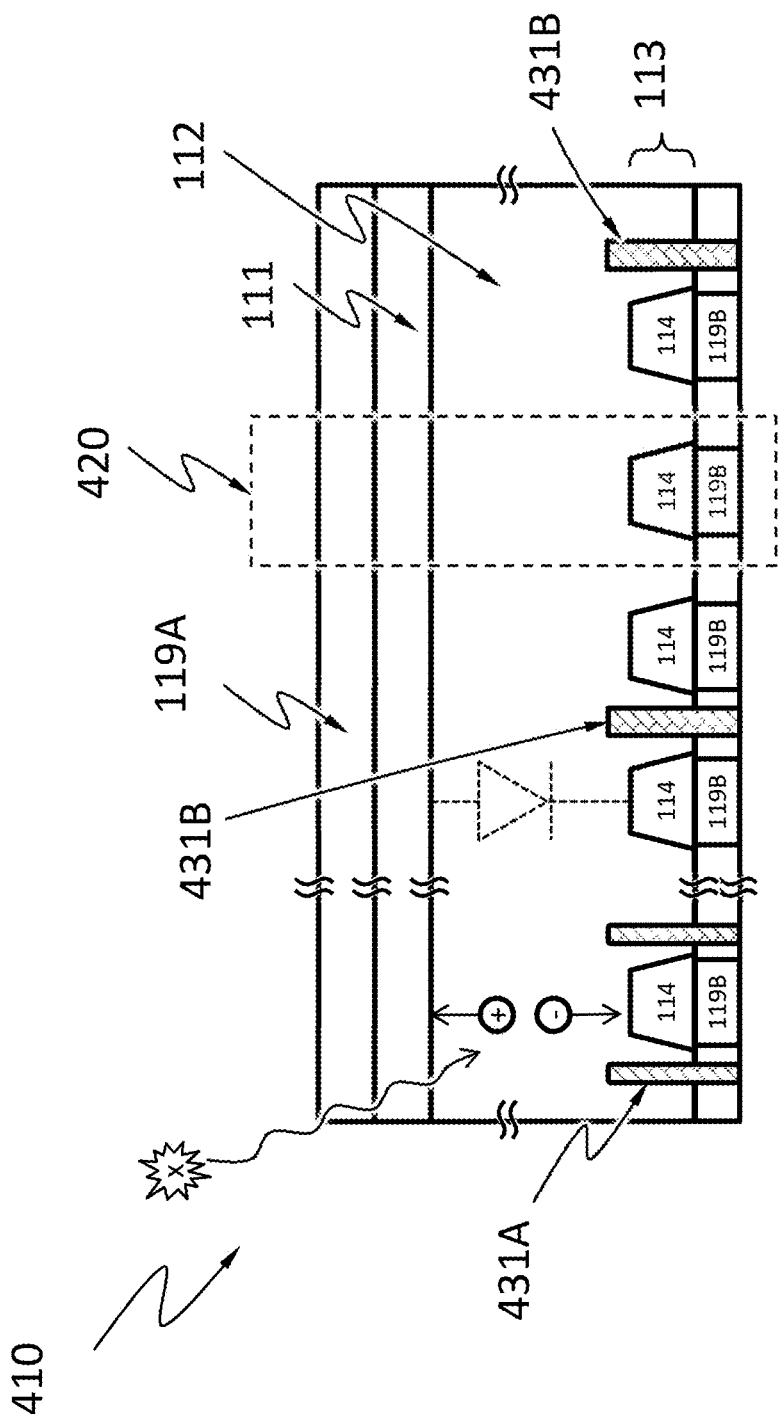
FIG. 1B schematically shows a detailed cross-sectional view of the absorption-unit array, according to an embodiment.

FIG. 1B schematically shows a detailed cross-sectional view of the absorption-unit array 410, according to an embodiment. The absorption-unit array 410 comprises a plurality of the absorption units 420. The absorption-unit array 410 may comprise a guard ring 431B. The guard ring 431B may encompass more than one of the absorption units 420. Each of the absorption units 420 may comprise a diode (e.g., p-i-n or p-n) formed by a first doped region 111, a discrete region 114 of a second doped region 113. Each of the absorption units 420 may comprise electric contacts 119A and 119B. The second doped region 113 may be separated from the first doped region 111 by an optional intrinsic region 112. The discrete portions 114 are separated from one another by the first doped region 111 or the intrinsic region 112. The electric contact 119B may include discrete portions each of which is in electric contact with the discrete regions 114. The first doped region 111 and the second doped region 113 have opposite types of doping (e.g., region 111 is p-type and region 113 is n-type, or region 111 is n-type and region 113 is p-type). In the example in FIG. 1B, each of the absorption units 420 comprises a diode formed by a discrete region 114 of the second doped region 113, the first doped region 111 and the optional intrinsic region 112. Namely, in the example in FIG. 1B, the absorption units 420 have the first doped region 111 as a shared electrode. The first doped region 111 may also have discrete portions. In the example in FIG. 1B, each of the absorption units 420 comprises the electric contact 119A and a discrete portion of the electric contact 119B. Namely, in the example in FIG. 1B, the absorption units 420 have the 119A as a shared electric contact. The electric contact 119A may also have discrete portions. Each of the absorption units 420 may comprise a guard ring 431A. The guard ring 431A may be placed around the discrete portion 114 of an absorption unit 420. The guard rings 431A and 431B may be formed by doped regions or by shallow trench isolation.

When an X-ray photon hits the absorption-unit array 410 including diodes, the X-ray photon may be absorbed and generate one or more charge carriers by a number of mechanisms. An X-ray photon may generate 10 to 100000 charge carriers. The charge carriers may drift to the electrodes of one of the absorption units under an electric field. The field may be an external electric field. In an embodiment, the charge carriers may drift in directions such that the charge carriers generated by a single X-ray photon are not substantially shared by two different absorption units 420 ("not substantially shared" here means less than 2%, less than 0.5%, less than 0.1%, or less than 0.01% of these charge carriers flow to the discrete region 114 of a different absorption unit 420 than the rest of the charge carriers.) Charge carriers generated by an X-ray photon incident on one absorption unit 420 are not substantially shared with another absorption unit 420. Substantially all (more than 98%, more than 99.5%, more than 99.9%, or more than 99.99% of) charge carriers generated by an X-ray photon incident on the absorption unit 420 flow to the discrete region 114 of the unit. Namely, less than 2%, less than 1%, less than 0.1%, or less than 0.01% of these charge carriers flow beyond the absorption unit. The guard ring 431B may prevent premature breakdown due to locally concentrated electric field at the edges of the discrete regions 114 and electric contacts 119B or preventing surface potential differences at the discrete regions 114 and electric contacts 119B.

Figure 1C:
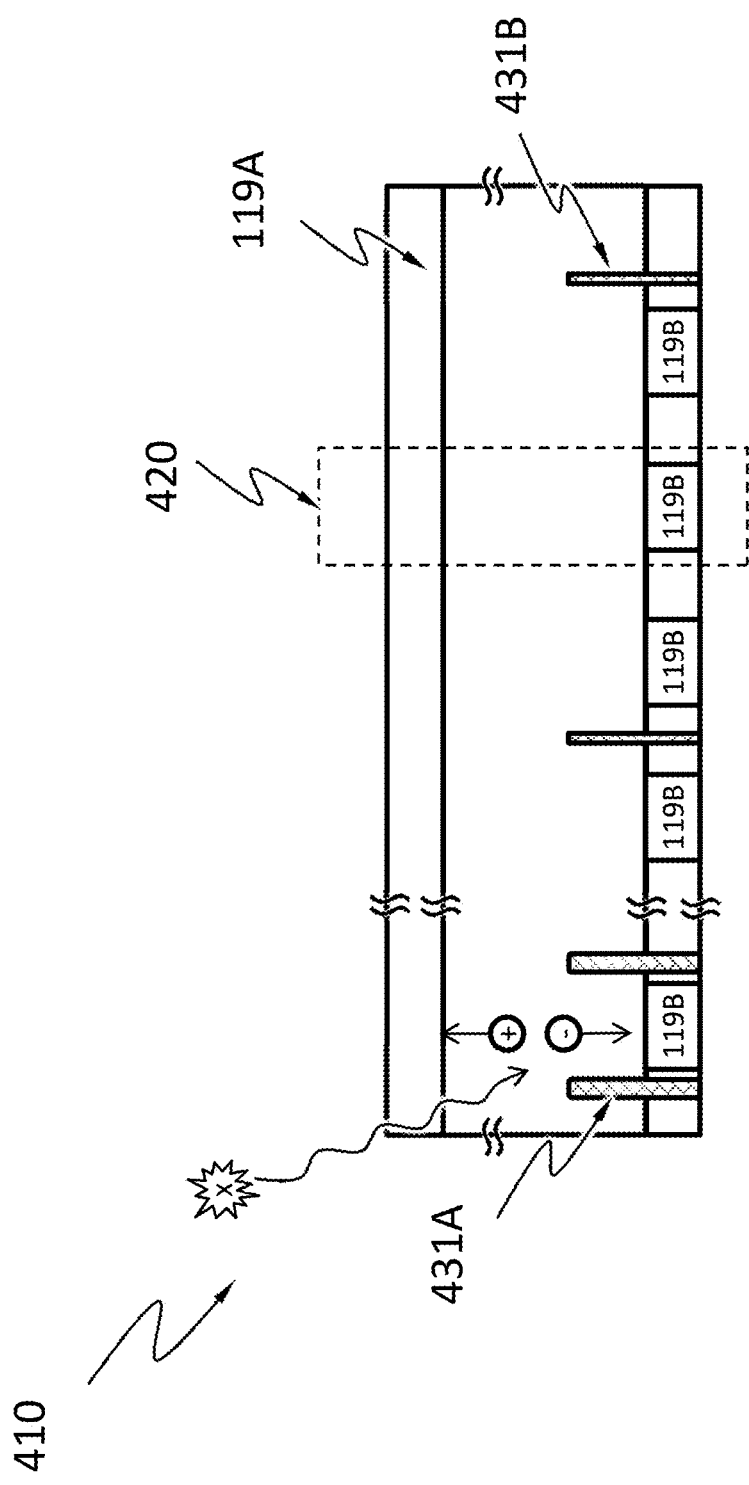
FIG. 1C schematically shows an alternative detailed cross-sectional view of the absorption-unit array, according to an embodiment.

FIG. 1C schematically shows an alternative detailed cross-sectional view of the absorption-unit array 410, according to an embodiment. The absorption-unit array 410 may comprise a plurality of absorption units 420. Each of the absorption units 420 may comprise the electric contact 119A, a discrete portion of the electric contact 119B and a resistor formed by a region of a semiconductor material such as, silicon, germanium, GaAs, CdTe, CdZnTe, or a combination thereof. The absorption-unit array 410 does not include a diode. The semiconductor may have a high mass attenuation coefficient for the X-ray energy of interest.

When an X-ray photon hits the absorption-unit array 410 including resistors but not diodes, it may be absorbed and generate one or more charge carriers by a number of mechanisms. An X-ray photon may generate 10 to 100000 charge carriers. The charge carriers may drift to the electric contacts 119A and 119B under an electric field. The field may be an external electric field. In an embodiment, the charge carriers may drift in directions such that the charge carriers generated by a single X-ray photon are not substantially shared by two different absorption units 420 ("not substantially shared" here means less than 2%, less than 0.5%, less than 0.1%, or less than 0.01% of these charge carriers flow to the discrete portion of the electric contact 119B of a different absorption unit 420 than the rest of the charge carriers.) Charge carriers generated by an X-ray photon incident on an absorption unit 420 are not substantially shared with another absorption unit 420. Substantially all (more than 98%, more than 99.5%, more than 99.9% or more than 99.99% of) charge carriers generated by an X-ray photon incident on the absorption unit 420 flow to the discrete portion of the electric contact 119B of the unit. Namely, less than 2%, less than 0.5%, less than 0.1%, or less than 0.01% of these charge carriers flow beyond the discrete portion of the electric contact 119B of the absorption unit 420.

Figure 2A:
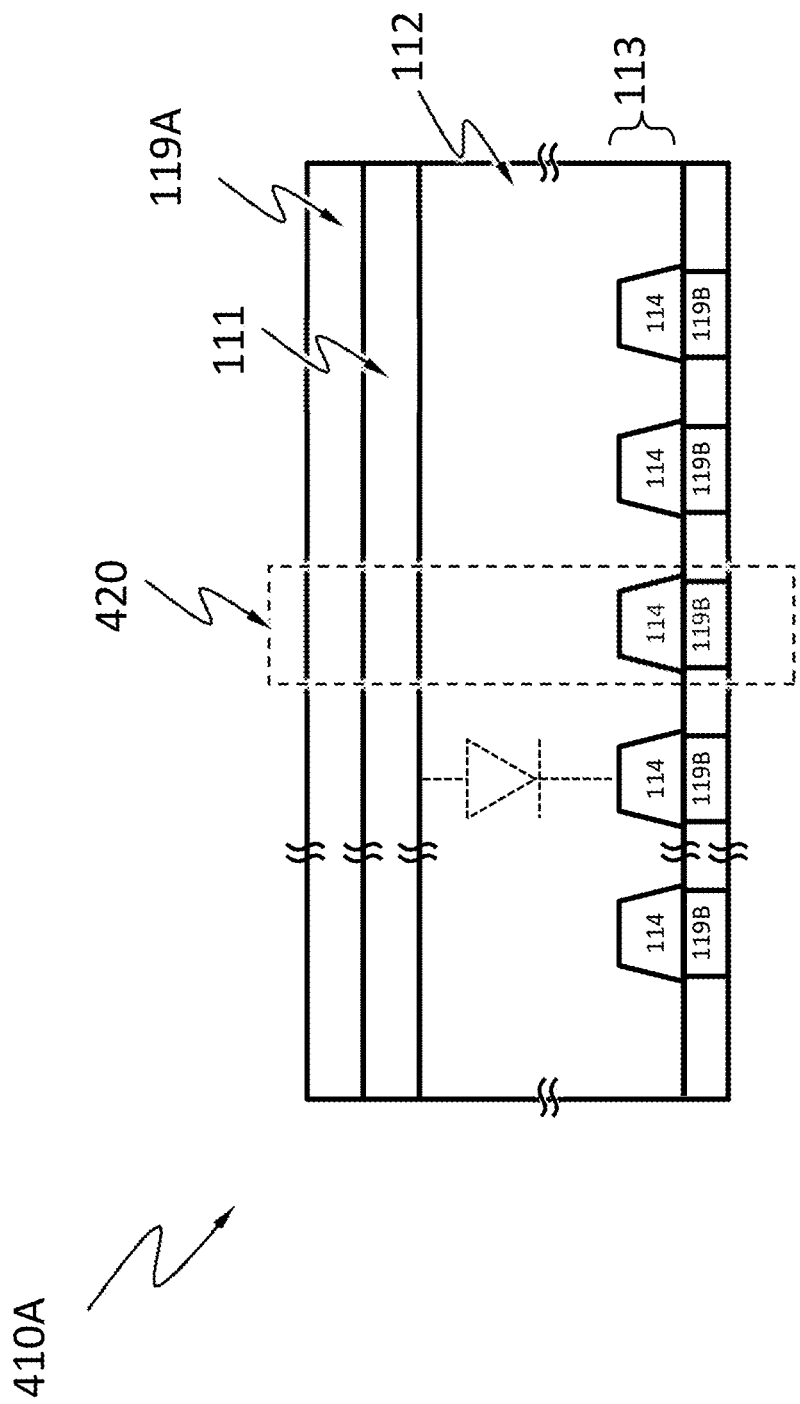
FIG. 2A schematically shows a detailed cross-sectional view of an absorption-unit array, according to an embodiment.
Figure 2B:
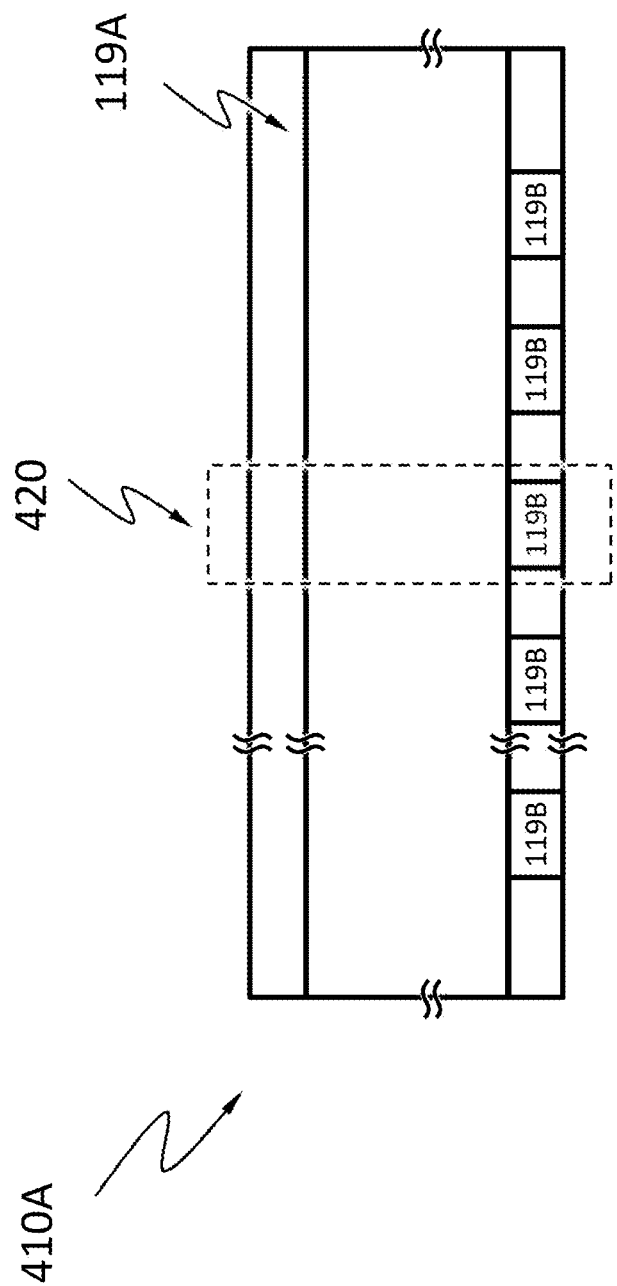
FIG. 2B schematically shows an alternative detailed cross-sectional view of the absorption-unit array of FIG. 2B, according to an embodiment.

FIG. 2A schematically shows a detailed cross-sectional view of the absorption-unit array 410A, according to an embodiment, where the absorption units 420 in the absorption-unit array 410A comprises diodes. FIG. 2B schematically shows an alternative detailed cross-sectional view of the absorption-unit array 410A, according to an embodiment, where the absorption-unit array 410A includes resistors but not diodes. At least one of the absorption units 420 does not comprise a guard ring therein. More than one of the absorption units 420 are not encompassed within a guard ring. The absorption-unit array 410A in these examples may not comprise any guard rings.

Figure 2C:
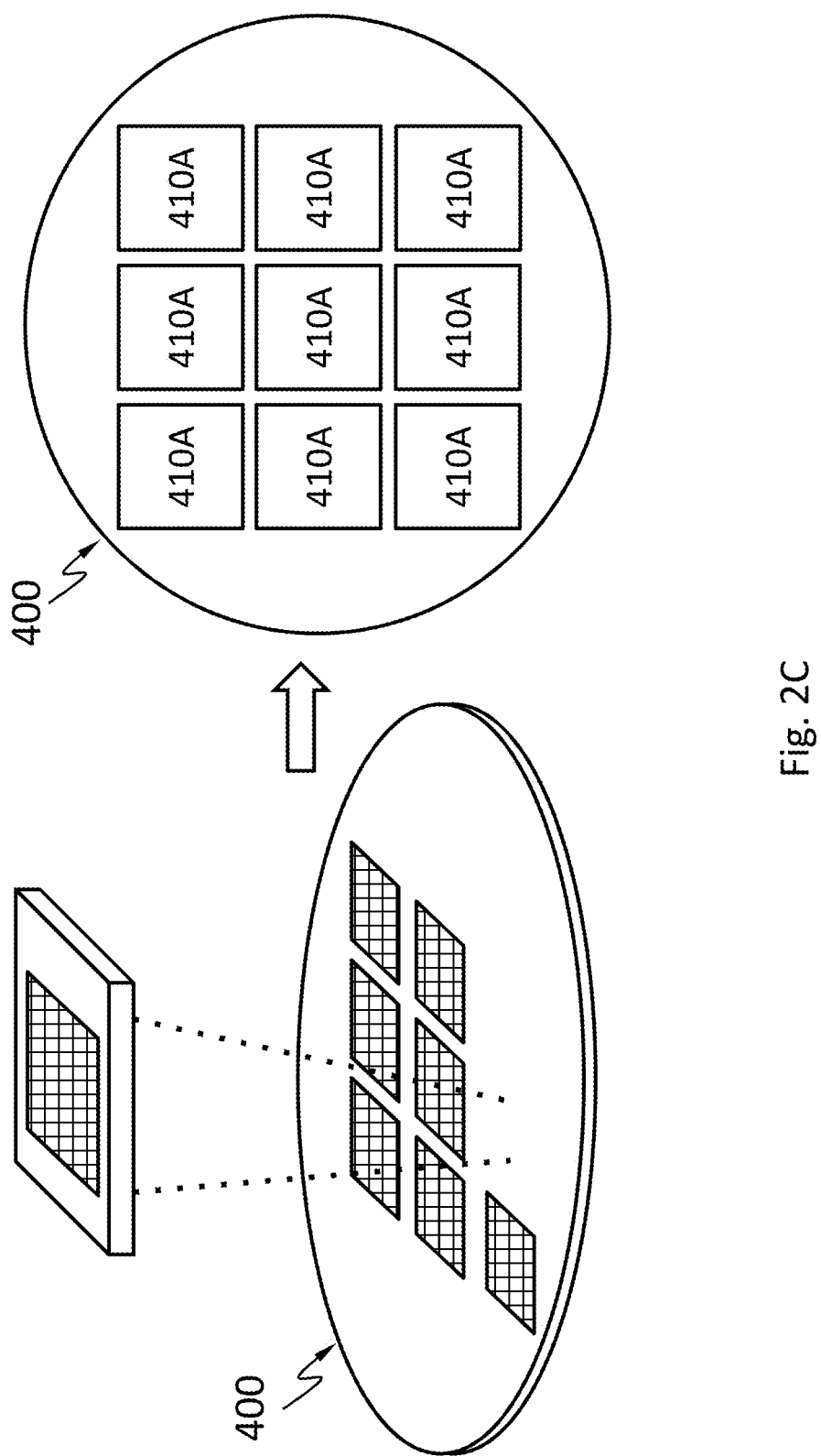
FIG. 2C and FIG. 2D schematically show a process of forming the absorption-unit array of FIG. 2A or FIG. 2B.
Figure 2D:
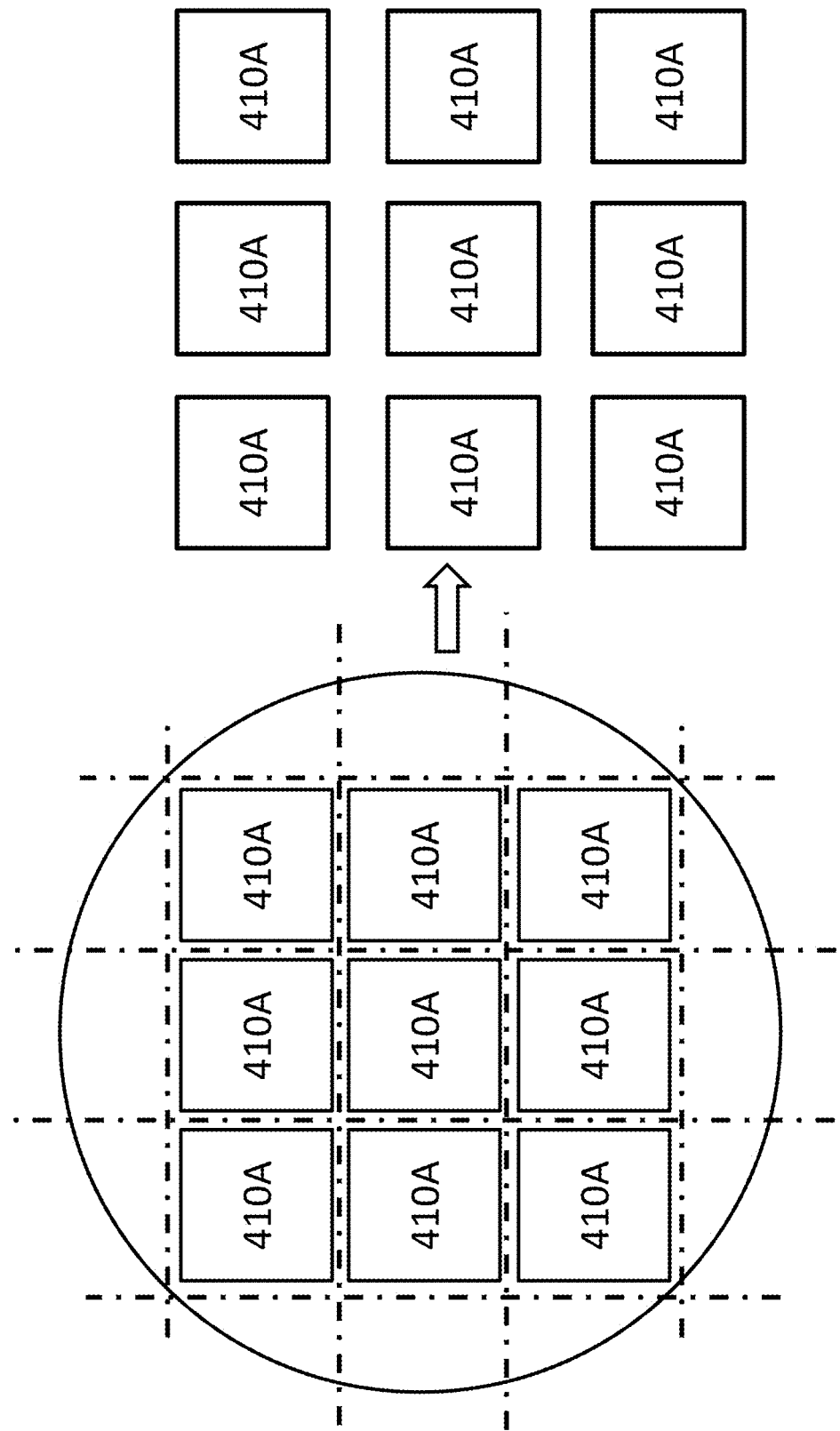

FIG. 2C and FIG. 2D schematically show a process of forming the absorption-unit array 410A, according to an embodiment.

FIG. 2C schematically shows forming the absorption-unit array 410A on the substrate 400. The absorption-unit array 410A may be formed with semiconductor lithography processes, including a combination of steps such as forming oxide film, applying photoresist, exposing, developing, etching, doping, and wiring. The substrate 400 may include one or more absorption-unit arrays 410A. In example of FIG. 2C, a plurality of absorption-unit array 410A are formed on the substrate 400. In example of FIG. 2C, areas of the absorption-unit arrays 410A are exposed one by one in an exposing process to pattern the same circuit pattern.

FIG. 2D schematically shows separating the absorption-unit array 410A from the substrate 400. Separating the absorption-unit array 410A from the substrate may be a dicing process involving scribing and breaking, mechanical sawing or laser cutting. In example of FIG. 2D, the absorption-unit arrays 410 are separated from the substrate 400 by dicing along the die streets or gaps in between the absorption-unit arrays 410.

Figure 3B:
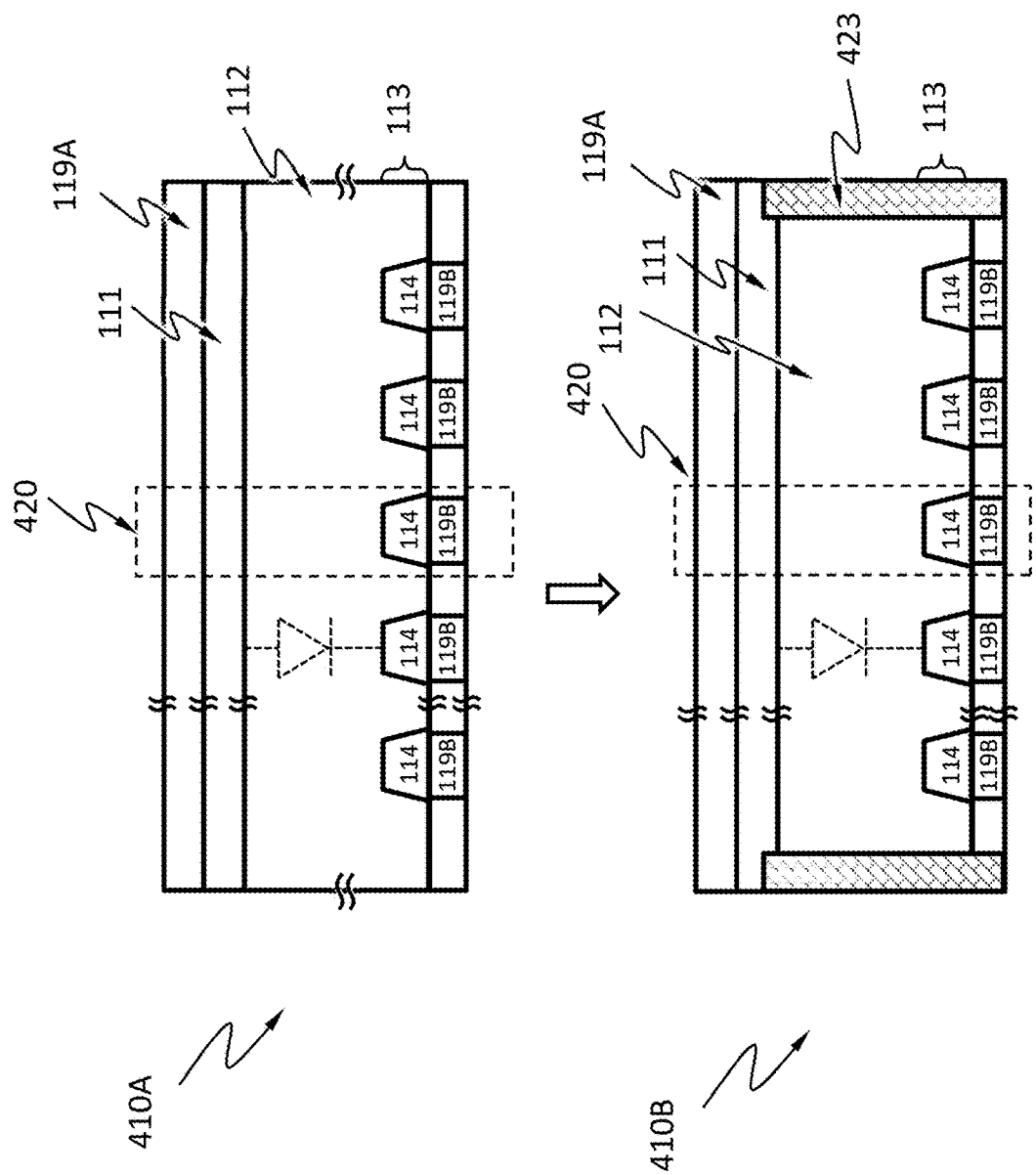

FIG. 3A-FIG. 3C schematically show forming the absorption-unit array 410B from the absorption-unit array 410A after separating the array 410A from the substrate, according to an embodiment.

FIG. 3A schematically shows the formation process from a perspective view of the absorption-unit arrays 410A and 410B, according to an embodiment. The absorption-unit array 410B is formed by forming a doped sidewall 423 (sometimes referred to as "active edge") on the absorption-unit array 410A after separating the array 410A from the substrate 400. The doped sidewall 423 may be formed by doping sidewalls of the absorption-unit array 410A and annealing. The doped sidewall 423 may be doped with the same type of doping agents as the discrete regions 114 of the absorption-unit array 410A, but with a different doping concentration (e.g., doped sidewall 423 is p-type and the discrete region 114 is P$^+$ type). The annealing may be laser annealing.

FIG. 3B schematically shows the formation process from a detailed cross-sectional view of the absorption-unit arrays 410A and 410B, according to an embodiment, where the absorption-unit arrays 410A and 410B include diodes. In example of FIG. 3B, the doped sidewall 423 encompasses more than one absorption units 420 (e.g., all the absorption units 420 of the absorption-unit array 410B when the doped sidewall 423 is placed around the perimeter of the absorption-unit array 410B).

FIG. 3C schematically shows the formation process from an alternative detailed cross-sectional view of the absorption-unit arrays 410A and 410B, according to an embodiment, where the absorption-unit array 410B includes resistors but not diodes.

Figure 4A:
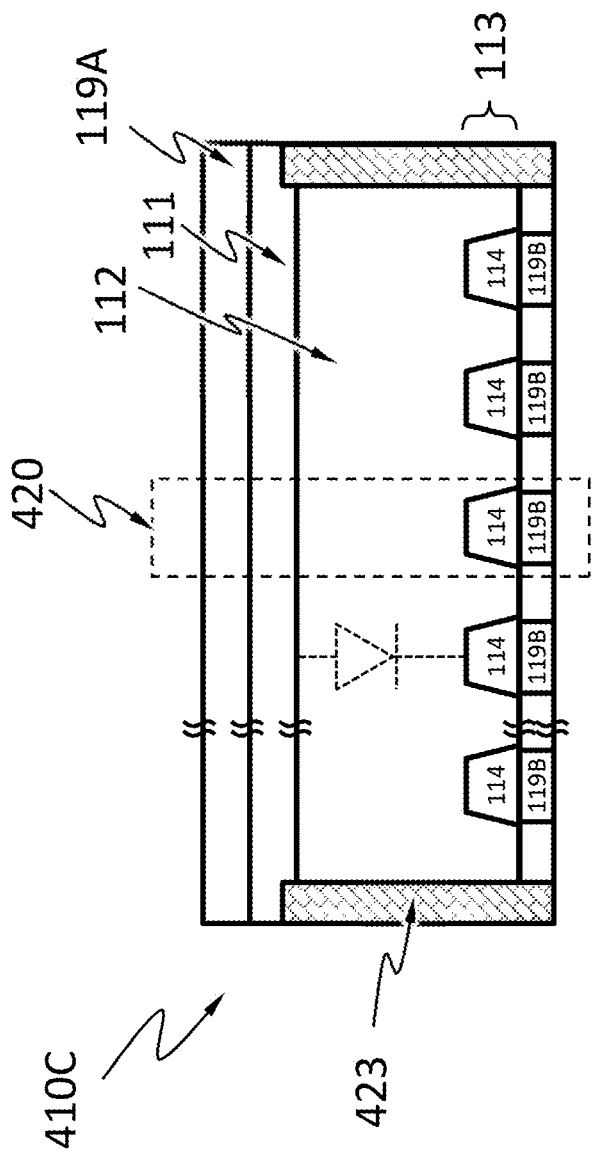
FIG. 4A schematically shows a detailed cross-sectional view of an absorption-unit array, according to an embodiment.
Figure 4B:
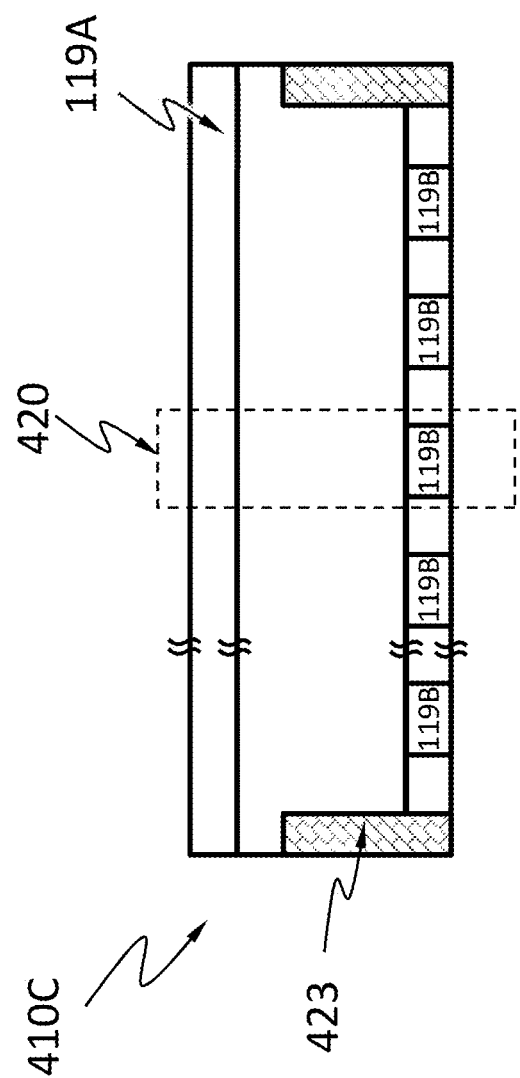
FIG. 4B schematically shows an alternative detailed cross-sectional view of the absorption-unit array of FIG. 4A, according to an embodiment.

FIG. 4A shows a detailed cross-sectional view of the absorption-unit array 410C, according to an embodiment, where the absorption-unit array 410C is one type of the absorption-unit array 410 including diodes. FIG. 4B schematically shows an alternative detailed cross-sectional view of the absorption-unit array 410C, according to an embodiment, where the absorption-unit array 410C includes resistors but not diodes. The absorption-unit array 410C comprises a plurality of the absorption units 420 and a doped sidewall 423. The doped sidewall 423 encompasses more than one of the absorption units 420. The absorption-unit array 410C may comprise more than one guard rings.

Figure 4C:
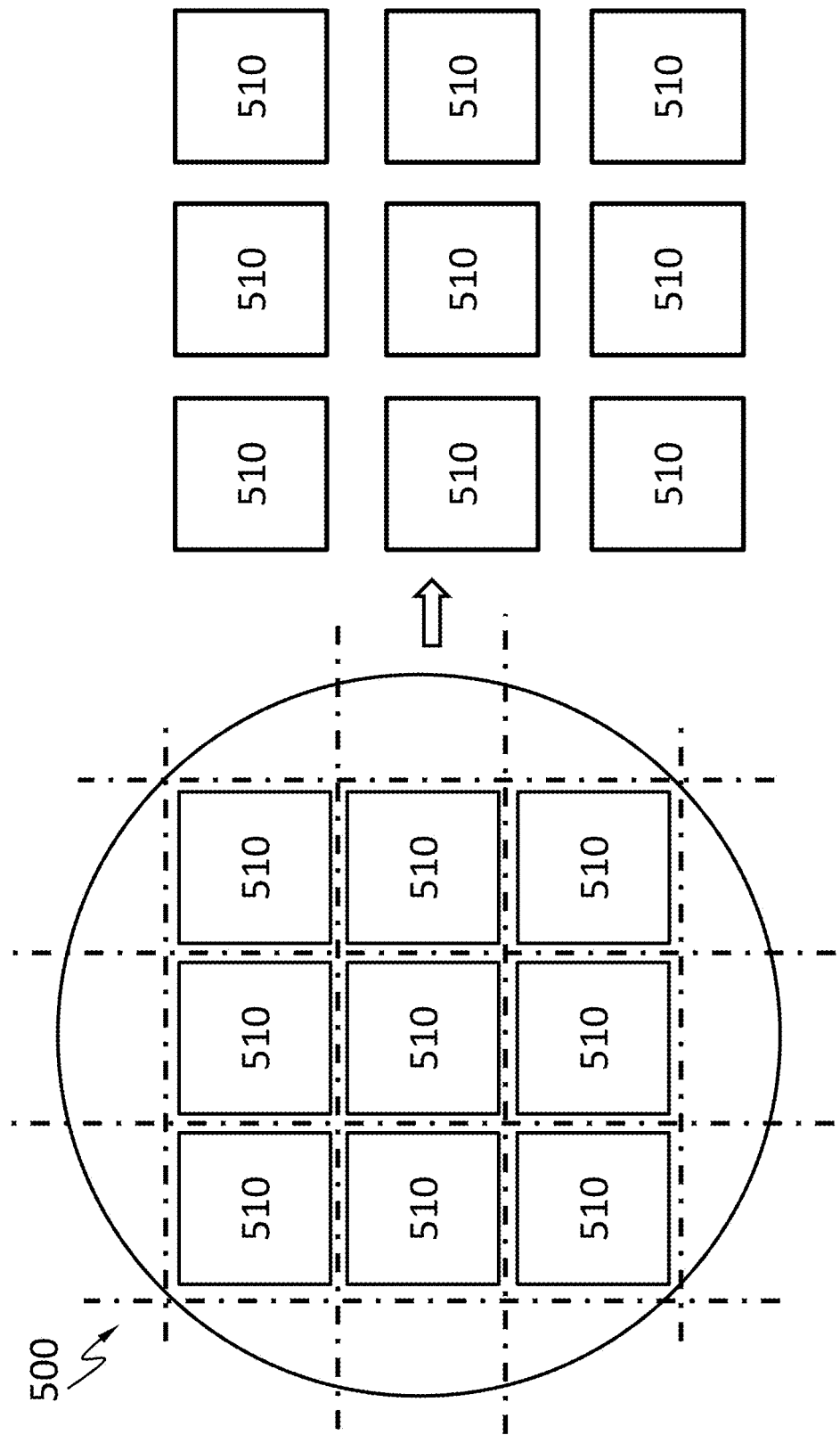
Figure 4D:
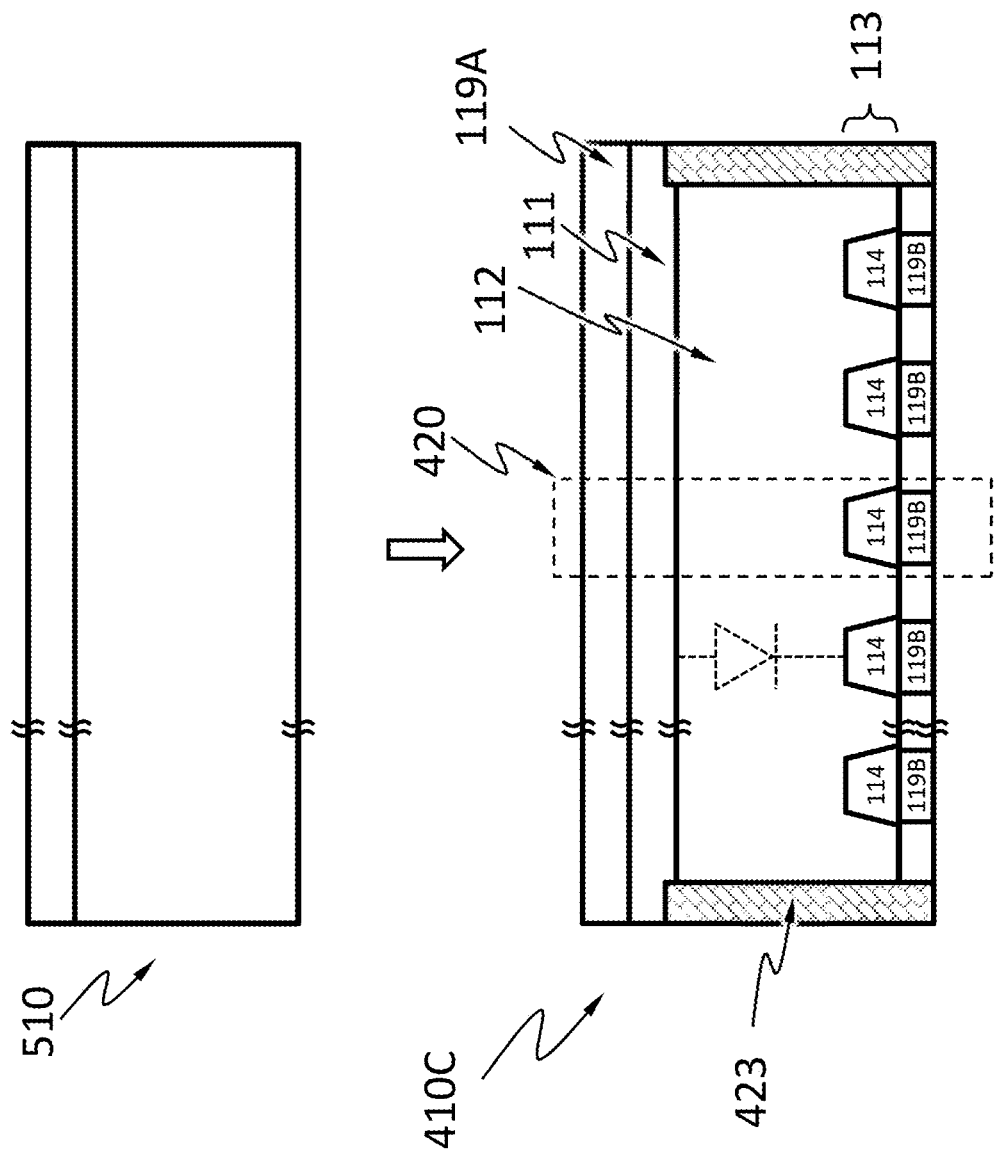

FIG. 4C-FIG. 4E schematically show a process of forming the absorption-unit array 410C, according to an embodiment.

FIG. 4C schematically shows separating a portion of a substrate 510 from the substrate 500. Separating the portion of the substrate 510 from the substrate 500 may be a dicing process involving scribing and breaking, mechanical sawing or laser cutting. The portion of the substrate 510 may include a semiconductor material such as, silicon, germanium, GaAs, CdTe, CdZnTe, or a combination thereof. The semiconductor material may have a high mass attenuation coefficient for the X-ray energy of interest. The portion of the substrate 510 may comprise doped regions.

FIG. 4D schematically shows forming the absorption-unit array 410C on the portion of the substrate 510 after separating the portion from the substrate 500, according to an embodiment, where the absorption-unit array 410C includes diodes. FIG. 4E schematically shows the formation process of the absorption-unit array 410C from an alternative detailed cross-sectional view of the portion of the substrate 510 and the absorption-unit array 410C, according to an embodiment, where the absorption-unit array 410C includes resistors but not diodes. The absorption units 420 may be formed with semiconductor lithography processes, including a combination of steps such as forming oxide film, applying photoresist, exposing, developing, etching, doping, and wiring. The doped sidewall 423 may be formed before, during or after forming the absorption units 420. The doped sidewall 423 may be formed by doping sidewalls of the portion of the substrate 510 and annealing. The annealing may be laser annealing.

Figure 5:
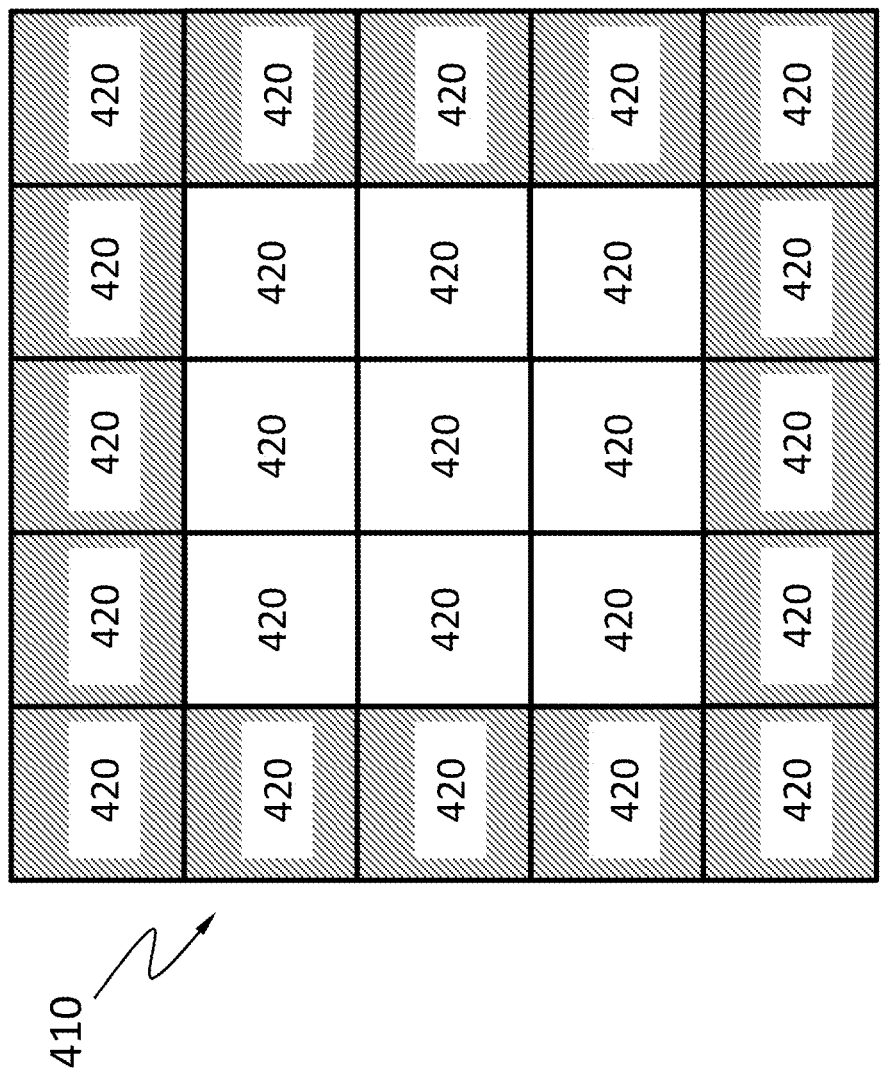
FIG. 5 schematically shows a method for using an absorption-unit array, according to an embodiment.

FIG. 5 schematically shows a method for using the absorption-unit array 410. An electric voltage is applied to the first plurality of absorption units 420 along the perimeter of the absorption-unit array 410 (e.g., those absorption units 420 that are hatched), so that the first plurality of absorption units 420 serves as a guard ring or provides electrical shied for the second plurality of absorption units in the interior of the absorption-unit array 410. The second plurality of absorption units may be configured to absorb X-rays and generate electrical signals.

Figure 6:
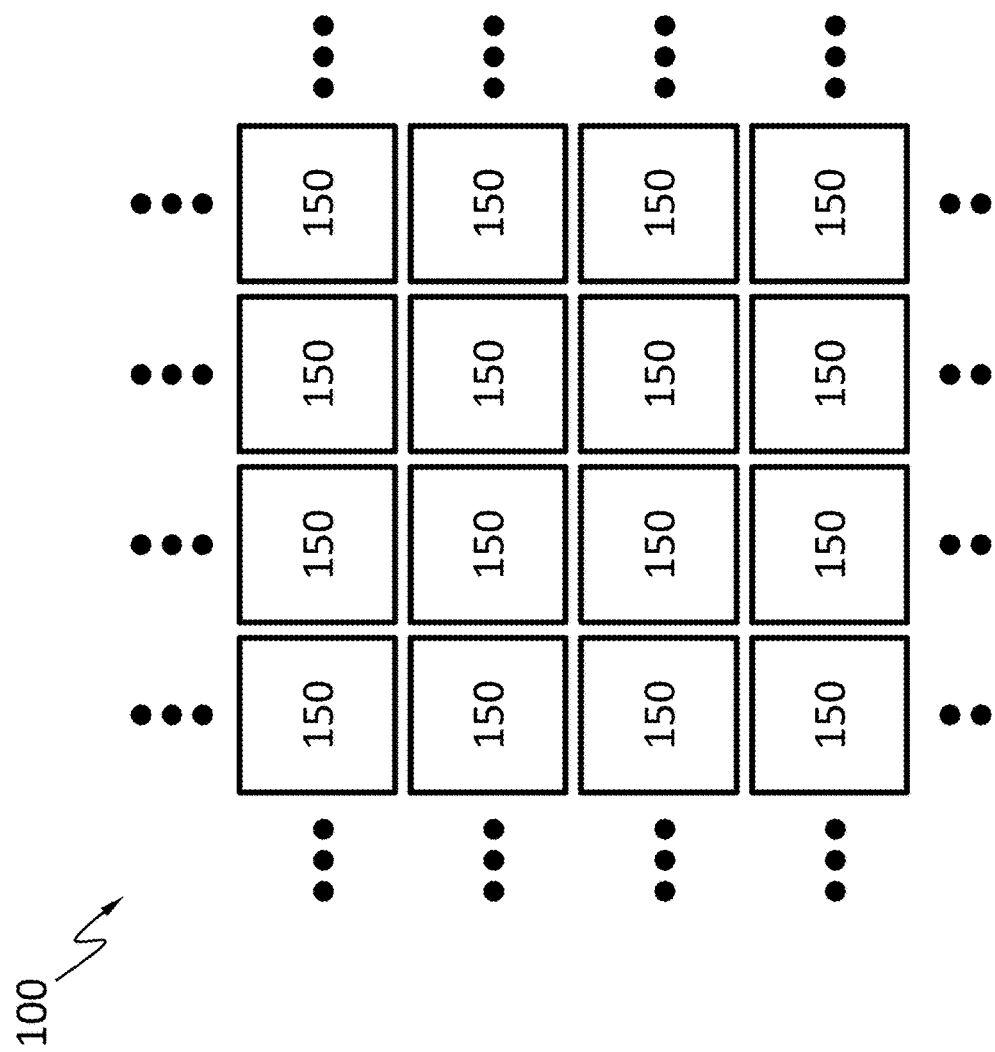
FIG. 6 schematically shows a detector, according to an embodiment.

FIG. 6 schematically shows a detector 100, according to an embodiment. The detector 100 has an array of pixels 150 such as any of the absorption-unit arrays described herein. The array may be a rectangular array, a honeycomb array, a hexagonal array or any other suitable array. Each pixel 150 is configured to detect an X-ray photon incident thereon and measure the energy of the X-ray photon. For example, each pixel 150 is configured to count numbers of X-ray photons incident thereon whose energy falls in a plurality of bins, within a period of time. All the pixels 150 may be configured to count the numbers of X-ray photons incident thereon within a plurality of bins of energy within the same period of time. Each pixel 150 may have its own analog-to-digital converter (ADC) configured to digitize an analog signal representing the energy of an incident X-ray photon into a digital signal. Each pixel 150 may be configured to measure its dark current, such as before or concurrently with each X-ray photon incident thereon. Each pixel 150 may be configured to deduct the contribution of the dark current from the energy of the X-ray photon incident thereon. The pixels 150 may be configured to operate in parallel. For example, when one pixel 150 measures an incident X-ray photon, another pixel 150 may be waiting for an X-ray photon to arrive. The pixels 150 may not have to be individually addressable.

The detector 100 may have at least 100, 2500, 10000, or more pixels 150. The detector 100 may be configured to add the numbers of X-ray photons for the bins of the same energy range counted by all the pixels 150. For example, the detector 100 may add the numbers the pixels 150 stored in a bin for energy from 70 KeV to 71 KeV, add the numbers the pixels 150 stored in a bin for energy from 71 KeV to 72 KeV, and so on. The detector 100 may compile the added numbers for the bins as a spectrum of the X-ray photons incident on the detector 100.

FIG. 7A schematically shows a cross-sectional view of the detector 100, according to an embodiment. The detector 100 may include an X-ray absorption layer 110 and an electronics layer 120 (e.g., an ASIC) for processing or analyzing electrical signals incident X-ray generates in the X-ray absorption layer 110. In an embodiment, the detector 100 does not comprise a scintillator. The X-ray absorption layer 110 may include a semiconductor material such as, silicon, germanium, GaAs, CdTe, CdZnTe, or a combination thereof. The semiconductor may have a high mass attenuation coefficient for the X-ray energy of interest.

Figure 7B:
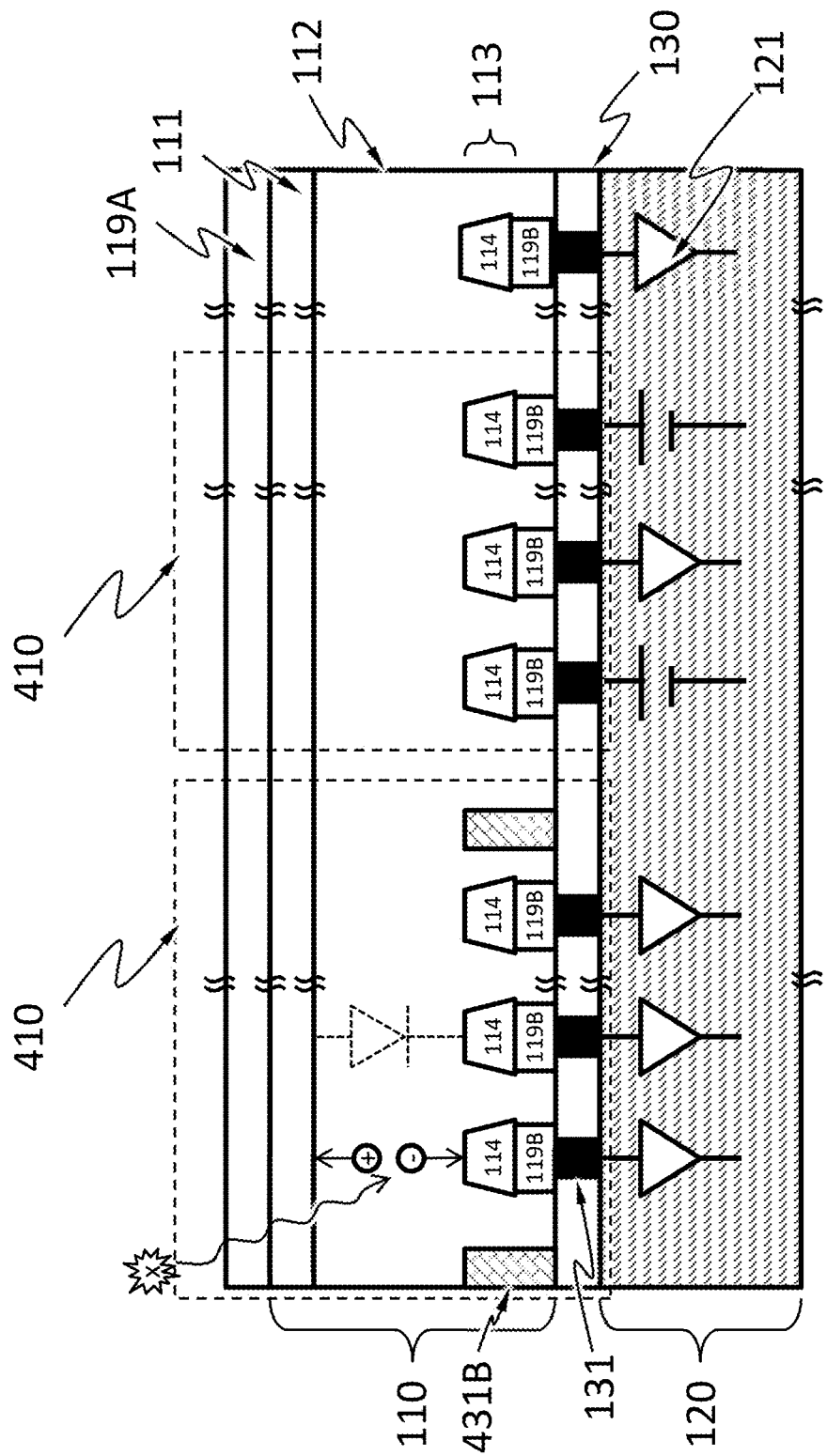
FIG. 7B schematically shows a detailed cross-sectional view of the detector, according to an embodiment.
Figure 7C:
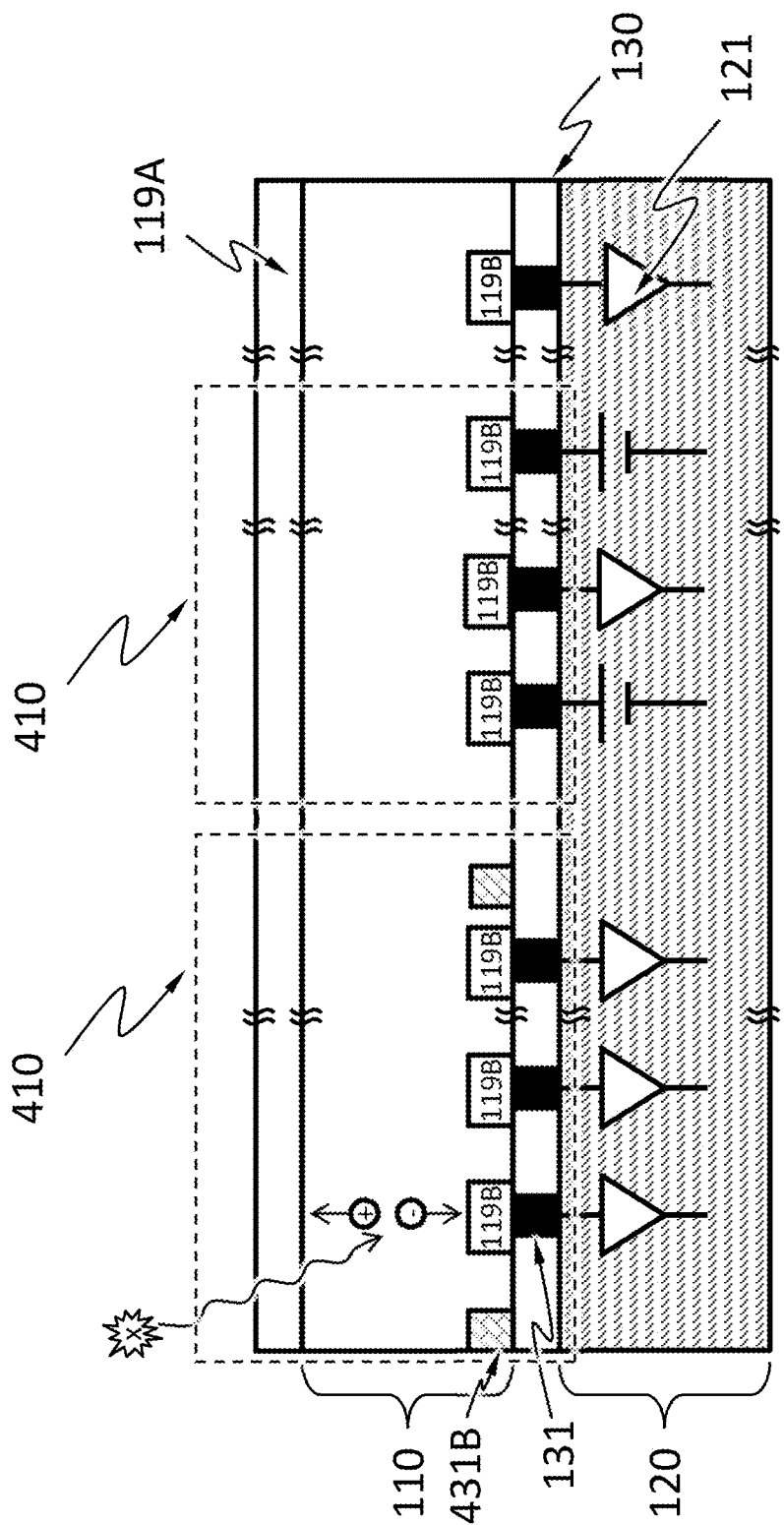
FIG. 7C schematically shows an alternative detailed cross-sectional view of the detector, according to an embodiment.

As shown in a detailed cross-sectional view of the detector 100 in FIG. 7B, according to an embodiment, the X-ray absorption layer 110 may include one or more absorption-unit arrays 410 including diodes. FIG. 7C schematically shows an alternative detailed cross-sectional view of the detector 100, according to an embodiment, where the X-ray absorption layer 110 includes resistors but not diodes. The absorption-unit array 410 may comprise guard rings (e.g., 431B). At least some of the absorption units 420 of the absorption-unit array 410 are configured to absorb X-rays and generate electrical signals. For example, the first plurality of absorption units 420 along the perimeter of the absorption-unit array 410 may serve as a guard ring or provides electrical shied for the second plurality of absorption units 420 in the interior of the absorption-unit array 410 by applying an electric voltage (e.g., the diodes of the first plurality of absorption units 420 are under higher reverse bias than the diodes of the second plurality of absorption units 420). The second plurality of absorption units 420 may be configured to absorb X-rays and generate electrical signals. Each of the absorption units 420 in the second plurality may associate with a pixel 150.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessors, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias.

Figure 8A:
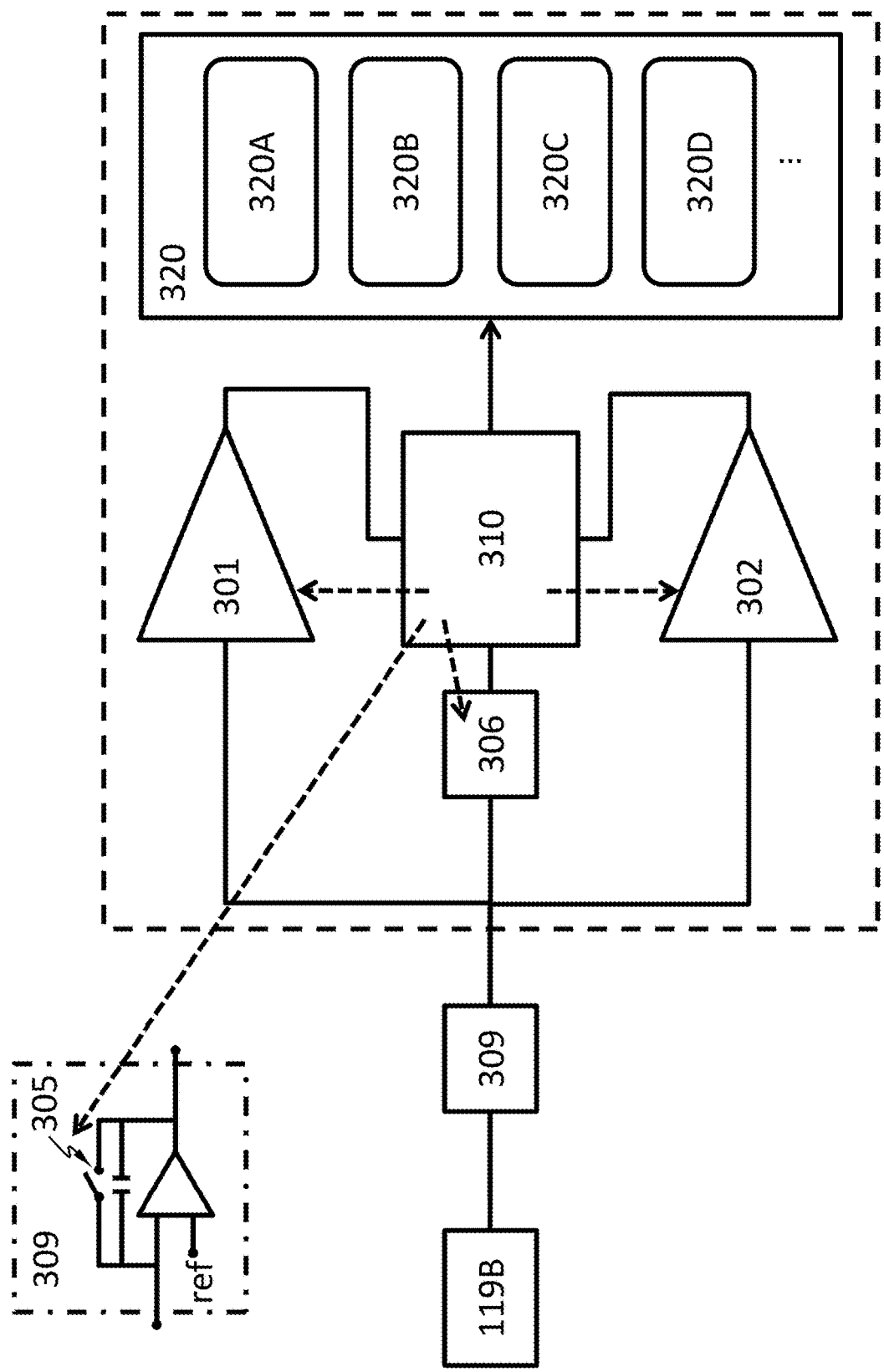
FIG. 8A and FIG. 8B each show a component diagram of the electronic system of the detector, according to an embodiment.
Figure 8B:
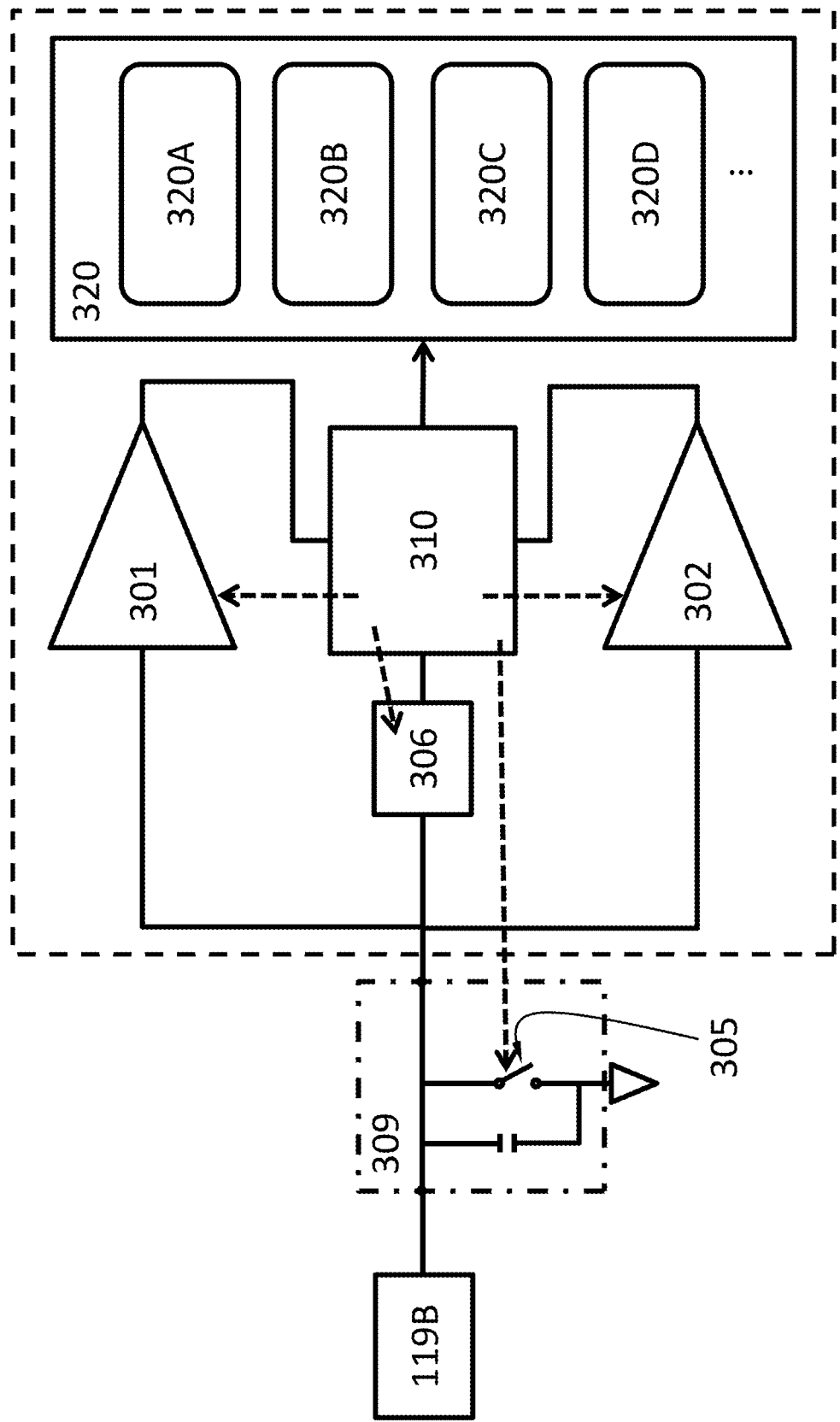

FIG. 8A and FIG. 8B each show a component diagram of the electronic system 121, according to an embodiment. The electronic system 121 may include a first voltage comparator 301, a second voltage comparator 302, a plurality of counters 320 (including counters 320A, 320B, 320C, 320D . . . ), a switch 305, an ADC 306 and a controller 310.

The first voltage comparator 301 is configured to compare the voltage of a discrete portion of the electric contact 119B to a first threshold. The first voltage comparator 301 may be configured to monitor the voltage directly, or calculate the voltage by integrating an electric current flowing through the diode or electrical contact over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident X-ray photon. The first voltage comparator 301 configured as a continuous comparator is especially suitable when the incident X-ray intensity is relatively high. The first voltage comparator 301 may be a clocked comparator, which has the benefit of lower power consumption. The first voltage comparator 301 configured as a clocked comparator may cause the system 121 to miss signals generated by some incident X-ray photons. When the incident X-ray intensity is low, the chance of missing an incident X-ray photon is low because the time interval between two successive photons is relatively long. Therefore, the first voltage comparator 301 configured as a clocked comparator is especially suitable when the incident X-ray intensity is relatively low. The first threshold may be 1-5%, 5-10%, 10%-20%, 20-30%, 30-40% or 40-50% of the maximum voltage one incident X-ray photon may generate on the electric contact 119B. The maximum voltage may depend on the energy of the incident X-ray photon (i.e., the wavelength of the incident X-ray), the material of the X-ray absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the diode or the electrical contact over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, & \text{if } x \geq 0 \\ -x, & \text{if } x \leq 0 \end{cases}.$$

The second threshold may be 200%-300% of the first threshold. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident X-ray. However, having a high speed is often at the cost of power consumption.

The counters 320 may be a software component (e.g., numbers stored in a computer memory) or a hardware component (e.g., 4017 IC and 7490 IC). Each counter 320 is associated with a bin for an energy range. For example, counter 320A may be associated with a bin for 70-71 KeV, counter 320B may be associated with a bin for 71-72 KeV, counter 320C may be associated with a bin for 72-73 KeV, counter 320D may be associated with a bin for 73-74 KeV. When the energy of an incident X-ray photons is determined by the ADC 306 to be in the bin a counter 320 is associated with, the number registered in the counter 320 is increased by one.

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electrical contact is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire after the voltage becomes stable, i.e., the rate of change of the voltage is substantially zero. The phase "the rate of change is substantially zero" means that temporal change is less than 0.1%/ns. The phase "the rate of change is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by one of the counters 320 to increase by one, if, during the time delay, the second voltage comparator 302 determines that the absolute value of the voltage equals or exceeds the absolute value of the second threshold, and the energy of the X-ray photon falls in the bin associated with the counter 320.

The controller 310 may be configured to cause the ADC 306 to digitize the voltage upon expiration of the time delay and determine based on the voltage which bin the energy of the X-ray photon falls in.

The controller 310 may be configured to connect the electric contact 119B to an electrical ground, so as to reset the voltage and discharge any charge carriers accumulated on the electric contact 119B. In an embodiment, the electric contact 119B is connected to an electrical ground after the expiration of the time delay. In an embodiment, the electric contact 119B is connected to an electrical ground for a finite reset time period. The controller 310 may connect the electric contact 119B to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The ADC 306 may feed the voltage it measures to the controller 310 as an analog or digital signal. The ADC may be a successive-approximation-register (SAR) ADC (also called successive approximation ADC). An SAR ADC digitizes an analog signal via a binary search through all possible quantization levels before finally converging upon a digital output for the analog signal. An SAR ADC may have four main subcircuits: a sample and hold circuit to acquire the input voltage ($V_{in}$), an internal digital-analog converter (DAC) configured to supply an analog voltage comparator with an analog voltage equal to the digital code output of the successive approximation register (SAR), the analog voltage comparator that compares $V_1$ to the output of the internal DAC and outputs the result of the comparison to the SAR, the SAR configured to supply an approximate digital code of $V_{in}$ to the internal DAC. The SAR may be initialized so that the most significant bit (MSB) is equal to a digital 1. This code is fed into the internal DAC, which then supplies the analog equivalent of this digital code (Vref/2) into the comparator for comparison with $V_{in}$. If this analog voltage exceeds $V_1$ the comparator causes the SAR to reset this bit; otherwise, the bit is left a 1. Then the next bit of the SAR is set to 1 and the same test is done, continuing this binary search until every bit in the SAR has been tested. The resulting code is the digital approximation of $V_{in}$ and is finally output by the SAR at the end of the digitization.

Figure 9:
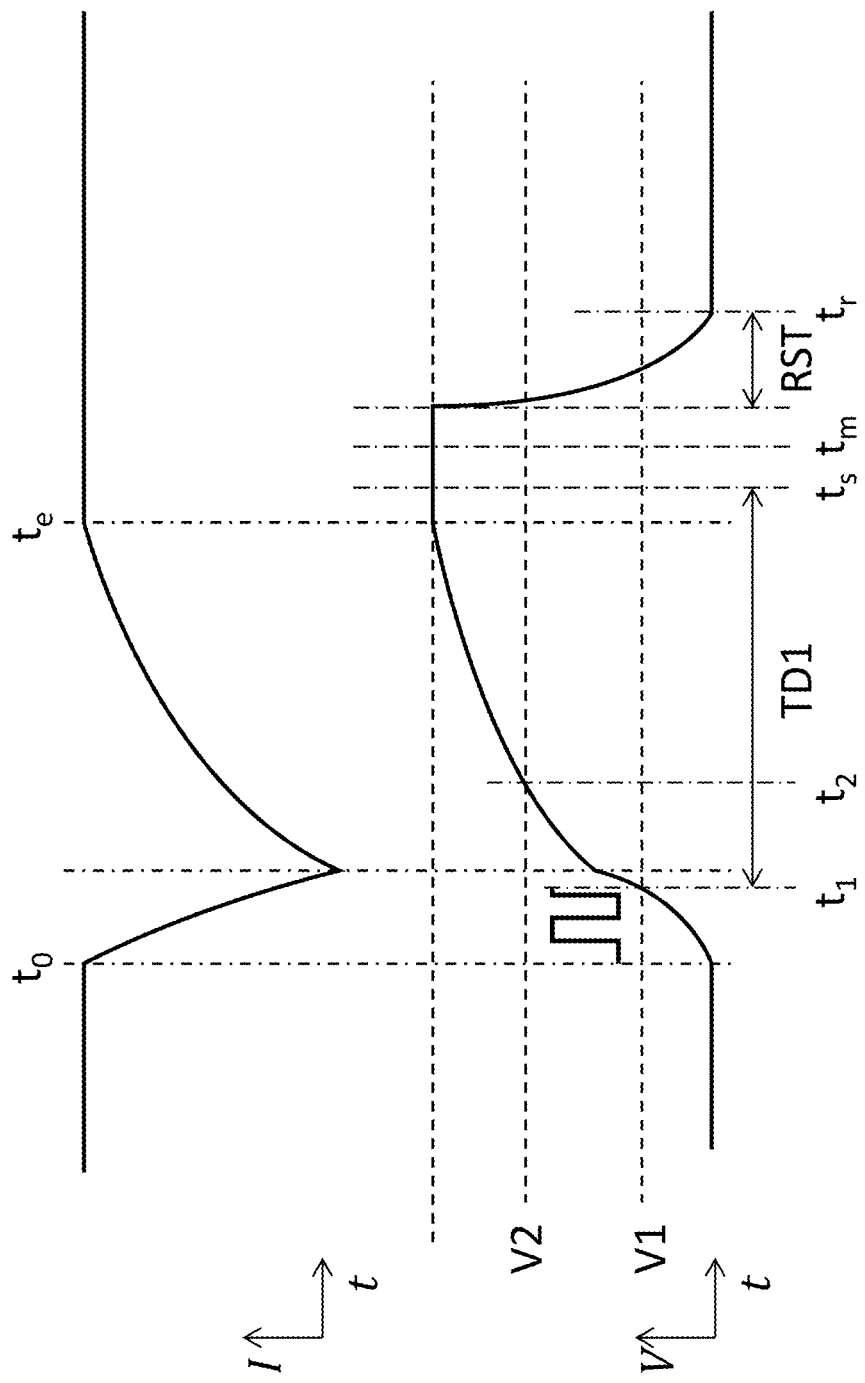
FIG. 9 schematically shows a temporal change of the electric current flowing through an electric contact (upper curve) caused by charge carriers generated by an X-ray photon incident on a pixel associated with the electric contact, and a corresponding temporal change of the voltage of the electric contact (lower curve), according to an embodiment.

The system 121 may include a capacitor module 309 electrically connected to the electric contact 119B, wherein the capacitor module is configured to collect charge carriers from the electric contact 119B. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 9, between $t_s$ to $t_0$). After the integration period has expired, the capacitor voltage is sampled by the ADC 306 and then reset by a reset switch. The capacitor module 309 can include a capacitor directly connected to the electric contact 119B.

FIG. 9 schematically shows a temporal change of the electric current flowing through the electric contact 119B (upper curve) caused by charge carriers generated by an X-ray photon incident on the pixel 150 associated with the electric contact 119B, and a corresponding temporal change of the voltage of the electric contact 119B (lower curve). The voltage may be an integral of the electric current with respect to time. At time to, the X-ray photon hits the diode or the resistor, charge carriers start being generated in the pixel 150, electric current starts to flow through the electric contact 119B, and the absolute value of the voltage of the electric contact 119B starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 waits for stabilization of the voltage to stabilize. The voltage stabilizes at time $t_e$, when all charge carriers generated by the X-ray photon drift out of the X-ray absorption layer 110. At time $t_s$, the time delay TD1 expires. At or after time $t_e$, the controller 310 causes the ADC 306 to digitize the voltage and determines which bin the energy of the X-ray photons falls in. The controller 310 then causes the number registered by the counter 320 corresponding to the bin to increase by one. In the example of FIG. 9, time $t_s$ is after time $t_e$; namely TD1 expires after all charge carriers generated by the X-ray photon drift out of the X-ray absorption layer 110. If time $t_e$ cannot be easily measured, TD1 can be empirically chosen to allow sufficient time to collect essentially all charge carriers generated by an X-ray photon but not too long to risk have another incident X-ray photon. Namely, TD1 can be empirically chosen so that time $t_s$ is empirically after time $t_e$. Time $t_s$ is not necessarily after time $t_e$ because the controller 310 may disregard TD1 once V2 is reached and wait for time $t_e$. The rate of change of the difference between the voltage and the contribution to the voltage by the dark current is thus substantially zero at $t_e$. The controller 310 may be configured to deactivate the second voltage comparator 302 at expiration of TD1 or at $t_2$, or any time in between.

The voltage at time $t_e$ is proportional to the amount of charge carriers generated by the X-ray photon, which relates to the energy of the X-ray photon. The controller 310 may be configured to determine the bin the energy of the X-ray photon falls in, based on the output of the ADC 306.

After TD1 expires or digitization by the ADC 306, whichever later, the controller 310 connects the electric contact 119B to an electric ground for a reset period RST to allow charge carriers accumulated on the electric contact 119B to flow to the ground and reset the voltage. After RST, the system 121 is ready to detect another incident X-ray photon. Implicitly, the rate of incident X-ray photons the system 121 can handle in the example of FIG. 9 is limited by 1/(TD1+RST). If the first voltage comparator 301 has been deactivated, the controller 310 can activate it at any time before RST expires. If the controller 310 has been deactivated, it may be activated before RST expires.

Because the detector 100 has many pixels 150 that may operate in parallel, the detector can handle much higher rate of incident X-ray photons. This is because the rate of incidence on a particular pixel 150 is 1/N of the rate of incidence on the entire array of pixels, where N is the number of pixels.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   forming an absorption-unit array on a substrate, the absorption-unit array comprising a plurality of absorption units configured to absorb X-rays, wherein at least one of the absorption units does not comprise a guard ring therein and not encompassed in a guard ring before the absorption-unit array is separated from the substrate;
   separating the absorption-unit array from the substrate.

2. The method of claim 1, wherein the absorption-unit array comprises silicon, germanium, GaAs, CdTe, CdZnTe, or a combination thereof.

3. The method of claim 1, wherein each of the absorption units comprises an electric contact.

4. The method of claim 1, wherein each of the absorption units comprises a diode.

5. The method of claim 1, wherein each of the absorption units comprises a resistor.

6. The method of claim 1, further comprising:
   forming a doped sidewall on the absorption-unit array after separating the absorption-unit array from the substrate, the doped sidewall encompassing more than one of the absorption units.

7. The method of claim 6, wherein forming the doped sidewall comprises doping sidewalls of the absorption-unit array and annealing.

8. A method comprising:
   separating a portion of a substrate from the substrate;
   forming an absorption-unit array on the portion of the substrate after separating the portion, the absorption-unit array comprising a plurality of absorption units and a doped sidewall, wherein the absorption units are configured to absorb X-rays, wherein the doped sidewall encompasses more than one of the absorption units.

9. The method of claim 8, wherein the absorption-unit array comprises silicon, germanium, GaAs, CdTe, CdZnTe, or a combination thereof.

10. The method of claim 8, wherein each of the absorption units comprises an electric contact.

11. The method of claim 8, wherein each of the absorption units comprises a diode.

12. The method of claim 8, wherein each of the absorption units comprises a resistor.

13. The method of claim 8, wherein forming the absorption-unit array comprises forming the doped sidewall by doping sidewalls of the portion of the substrate.

14. The method of claim 8, wherein the doped sidewall is formed before the absorption units are formed.

15. The method of claim 8, wherein the doped sidewall is formed after the absorption units are formed.

\* \* \* \* \*